United States Patent
Cho

(10) Patent No.: US 8,136,477 B2
(45) Date of Patent: Mar. 20, 2012

(54) APPARATUS FOR AND METHOD OF DISPENSING CHEMICAL SOLUTION IN SPIN-COATING EQUIPMENT

(75) Inventor: Seung-Ki Cho, Hwaseong-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 1201 days.

(21) Appl. No.: 11/867,744

(22) Filed: Oct. 5, 2007

(65) Prior Publication Data
US 2008/0107796 A1    May 8, 2008

(30) Foreign Application Priority Data
Nov. 3, 2006  (KR) .................. 10-2006-0108127

(51) Int. Cl.
B05C 11/00 (2006.01)
B05C 11/02 (2006.01)
B05C 5/00 (2006.01)
B05B 15/02 (2006.01)

(52) U.S. Cl. .......... 118/692; 118/684; 118/52; 118/612; 118/302

(58) Field of Classification Search .............. 118/52, 118/612, 56, 319, 320, 692, 684, 302, 712; 396/604, 611, 627; 134/153, 198, 902; 427/240; 156/345–15, 345.16; 222/105, 107; 430/271.1
See application file for complete search history.

(56) References Cited

U.S. PATENT DOCUMENTS

| | | | |
|---|---|---|---|
| 5,102,010 A * | 4/1992 | Osgar et al. ................... 222/1 |
| 5,782,978 A | 7/1998 | Kinose et al. | |
| 5,912,043 A | 6/1999 | Choi et al. | |
| 6,165,270 A | 12/2000 | Konishi et al. | |
| 6,332,924 B1 | 12/2001 | Shim et al. | |
| 6,872,256 B2 * | 3/2005 | Kitano et al. ................... 118/323 |
| 2003/0180471 A1 * | 9/2003 | Takekuma et al. .............. 427/421 |
| 2005/0263184 A1 | 12/2005 | Choi et al. | |
| 2007/0017635 A1 * | 1/2007 | Lee et al. ................... 156/345.15 |

* cited by examiner

Primary Examiner — Yewebdar Tadesse
(74) Attorney, Agent, or Firm — Volentine & Whitt, PLLC

(57) ABSTRACT

A chemical solution is uniformly dispensed from a nozzle by $N_2$ in spin-coating equipment. The dispensing apparatus includes a canister configured to receive a bottle containing the chemical solution, gas supply piping connecting a source of $N_2$ to the inside of the canister, a pressure control valve disposed in the gas supply piping, a chemical supply line by which the bottle is connected to the nozzle, a pressure sensor for sensing the pressure of the chemical solution supplied from the bottle, and a controller that controls the pressure control valve on the basis of the pressure sensed by the pressure sensor. The controller opens the pressure control valve further when the value of the signal output by the pressure sensor is less than a value representative of the minimum of a predetermined pressure range, and closes the pressure control valve further when the value of the signal output by the pressure sensor is greater than a value representative of the maximum of the predetermined pressure range. The degree to which the pressure control is open is thus controlled by feedback from the pressure control sensor such that the pressure of the chemical solution remains substantially constant as it is dispensed from the nozzle.

7 Claims, 2 Drawing Sheets

APPARATUS FOR AND METHOD OF DISPENSING CHEMICAL SOLUTION IN SPIN-COATING EQUIPMENT

BACKGROUND OF THE INVENTION

1. Field of the Invention

The present invention relates to spin-coating equipment for coating a substrate with a chemical solution such as a photoresist solution. More particularly, the present invention relates to a method of and apparatus for dispensing chemical solution onto a substrate in spin-coating equipment.

2. Discussion of Related Art

In general, the manufacturing of semiconductor devices includes fabrication, assembly and test processes. The fabrication processes involve processing a substrate, e.g., a polished silicon wafer, and include diffusion, thin-film formation, photolithography, and etching processes which are each well-known per se. These fabrication processes are repeatedly and selectively performed on the wafer to form electronic circuitry. Thus, the semiconductor device fabrication processes form an intermediate product which is later packaged, through an assembly process, and tested.

Among the aforementioned fabrication processes, photolithography is a process in which a circuit pattern is transferred to the wafer. First, an oxide layer is formed on a surface of the wafer to protect the surface. Then, one or more thin films are formed on the wafer by epitaxial growth or deposition processes. Next, a photosensitive chemical solution is dispensed onto the wafer, i.e., over the thin film(s). Subsequently, the wafer is rotated at a high speed so that a uniform film of the photosensitive solution is formed on the wafer. The photosensitive layer is baked to remove a volatile component of the solution and thereby leave a layer of photoresist on the wafer. Next, light is directed onto the wafer through a photo mask or reticle that bears a pattern corresponding to that which is to be formed on the wafer. Thus, the photoresist layer on the wafer is exposed to an image of the pattern borne by the photo mask. As a result, portions of the photoresist layer impinged by incident light undergo a photochemical reaction. That is, a kind of virtual image of the pattern of the photo mask is transferred to the photoresist layer.

Subsequently, the exposed layer of photoresist is developed to remove either the reacted portions of the photoresist layer (in the case of a positive photoresist) or non-reacted portions of the photoresist layer (in the case of a negative photoresist). Accordingly, the photoresist layer is patterned. Subsequently, the thin film(s) underlying the photoresist layer is/are etched with gas (dry etching) or chemicals (wet etching) using the patterned photoresist layer as an etch mask. As a result, a pattern is formed on the wafer from the thin film(s).

In a photolithography process as described above, the photoresist layer plays a very important role in the forming of the pattern on the wafer. In particular, the accuracy of critical dimensions (CD) of the pattern depends on the thickness and uniformity of the photoresist layer. In this respect, the photosensitive chemical solution must be properly and carefully dispensed onto the wafer if a photoresist layer having the desired thickness and/or uniformity is to be formed.

For instance, the photosensitive solution should not contain bubbles when it is dispensed onto the wafer. Conventional apparatus for applying a chemical solution onto a wafer employs sensors to prevent a solution containing bubbles from being dispensed onto a wafer. A first one of the sensors is installed in an upstream end of a storage tank switch valve, and an auxiliary sensor connected between the storage tank switch valve and the pipe from which the chemical solution is dispensed. In this apparatus, even if the first sensor malfunctions, the chemical solution is checked for bubbles by the auxiliary sensor.

Furthermore, apparatus for dispensing a chemical solution onto a wafer is disclosed in U.S. Pat. No. 6,332,924 B1. This patent discloses the use of a diaphragm pump and feed unit for dispensing a metered amount of chemical solution under a controlled pressure onto a wafer.

FIG. 1 is a schematic diagram of still another conventional apparatus for dispensing a chemical solution onto a wafer in spin-coating equipment. The apparatus has a canister 12 which receives a bottle 10 containing the chemical solution. An $N_2$ purge gas supply source 11 is connected to the canister 12 by an $N_2$ purge gas supply pipe 14 so that $N_2$ is supplied into the canister 12 to pressurize the interior of the canister 12. The pressure forces the chemical solution out of the bottle 10 and into a chemical supply pipe 16 extending from the bottle 10.

A trap for air bubbles is disposed in the chemical supply pipe 16. The trap has the form of a tank 18 so as to receive a predetermined amount of the chemical solution flowing into the chemical supply pipe 16 from bottle 10. To this end, a photo sensor 20 having a light emitter unit and a light receptor senses whether chemical solution is present at a certain level in the tank 18. Signals generated by the photo sensor 20 are issued to a controller 28 which controls the flow of the chemical solution in the dispensing apparatus.

The bottom of the tank 18 is connected to a filter 22 via the chemical supply pipe 16. The filter 22 filters out foreign material, remnants of the chemical solution, etc. from the chemical solution. A dispensing pump 24, having two stepper motors, is connected to the filter 22 to pump the chemical solution through the apparatus.

More specifically, the controller 28 drives the dispensing pump 24 to pump chemical solution from the bottle 10 to the tank 18 when the photo sensor 20 senses that the tank 18 does not contain a predetermined amount of chemical solution. The dispensing apparatus also includes a three way valve 30 that selects a flow path of the chemical solution so that the chemical solution dispensed by the dispensing pump 24 is re-circulated or dispensed. An automatic valve 34 controls the amount of chemical solution to be dispensed under the control of the controller 28.

When chemical solution is to be applied to the wafer W, the $N_2$ purge gas is supplied from the $N_2$ purge gas supply source 11 to force the chemical solution stored from the bottle 10 and into the tank 18 via the chemical supply pipe 16. Then, the controller 28 opens the automatic valve 34, positions the three way valve 30 such that the nozzle 36 is in open communication with the tank 18, and turns on the dispensing pump 24. The dispensing pump 24 draws the chemical solution out of the tank 18 and through the filter 22, and forces the filtered solution out of the nozzle 36 and onto the wafer W. The automatic valve 34 remains open until a predetermined amount (for example 3.5±0.2 g) of the chemical solution pressurized by the dispensing pump 24 is dispensed from nozzle 36.

When the chemical solution is not to be dispensed, the controller 28 closes the automatic valve 34. Also, the controller 28 positions the three way valve 30 such that the chemical solution drawn from the tank 18 by the dispensing pump 28 is re-circulated to the tank 18 through a chemical recirculation pipe 32.

The conventional dispensing apparatus described above is expensive to manufacture. In particular, the dispensing pump 24 and the three way valve 30 are very expensive components.

Furthermore, the dispensing pump 24 and the three way valve 30 become contaminated after a period of time (typically about three months in a conventional application) and thus, must be eventually replaced. Accordingly the maintenance costs associated with the conventional dispensing apparatus are also relatively high.

Moreover, the conventional dispensing apparatus takes a long time to empty the bottle 10 in dispensing the solution onto wafers. For example, the the conventional dispensing apparatus takes about five hours to empty a bottle of PIX3400 (1000 cc), which is a known type of photoresist solution. This is because a motor of the dispensing pump 24 must be driven slowly to prevent an excessive amount of bubbles from being formed in the solution. Thus, the conventional dispensing apparatus is rather inefficient.

SUMMARY OF THE INVENTION

An object of the present invention is to provide apparatus for dispensing a chemical solution in spin-coating equipment, which is relatively inexpensive, has low costs associated with the maintenance thereof, and yet can dispense the chemical solution substantially uniformly.

Another object of the present invention is to provide a method of and apparatus for dispensing a chemical solution in spin-coating equipment, which can dispense the chemical solution substantially uniformly and in a relatively short amount of time, i.e., which are highly efficient.

A more specific object of the present invention is to provide a method of and apparatus for dispensing a chemical solution in spin-coating equipment, which obviate the need for expensive components such as a fluid pump and three-way valve.

In accordance with one aspect of the present invention, apparatus for dispensing a chemical solution has a canister configured to receive a bottle containing the chemical solution, gas supply piping connecting the canister and a source of gas, a pressure control valve disposed in the gas supply piping, a nozzle connected to the canister and from which the chemical solution is dispensed by the apparatus, a pressure sensor disposed in-line in the apparatus between the canister and the nozzle so as to sense the pressure of the chemical solution that has left the canister, and a controller that controls the pressure control valve on the basis of the pressure sensed by the pressure sensor.

The dispensing apparatus also has a trap comprising a tank, a first chemical supply line extending from the canister to the tank and through which chemical solution can flow into the tank from a bottle received by the canister, and a second chemical supply line extending between and connecting the tank and the nozzle.

The controller is configured to compare a value of a signal output by the pressure sensor with values representing a predetermined pressure range. The controller controls the pressure control valve to move toward an open position thereof when the value of the signal output by the pressure sensor is less than a value representative of the minimum of the predetermined pressure range, and controls the pressure control valve to move toward a closed position thereof when the value of the signal output by the pressure sensor is greater than a value representative of the maximum of the predetermined pressure range. Thus, the degree to which the pressure control valve is open (or closed) is controlled by feedback from the pressure sensor such that the pressure of the chemical solution remains substantially constant as it is dispensed from the nozzle.

In accordance with another aspect of the present invention, the dispensing apparatus also has means for preventing the chemical solution from being dispensed while bubbles are entrained in the solution. In this respect, the trap has an exhaust line connected to an upper end of the tank, and a vent valve disposed in the exhaust line. Thus, air in the tank can be vented through the exhaust line and vent valve. Also, a bubble sensor is operatively associated with the second chemical supply line so as to sense whether bubbles are present in chemical solution flowing through the second chemical supply line towards the nozzle. The controller is operatively connected to the bubble sensor so as to generate an interlock signal that stops the operation of the dispensing apparatus when bubbles are sensed by the bubble sensor.

According to another aspect of the present invention, there is provided a method of dispensing a chemical solution onto a substrate which uses only gas pressure to ensure that the chemical solution is dispensed uniformly. The method is carried out by feeding the gas through gas supply piping into a canister in which a bottle containing the chemical solution is received, and adjusting the pressure of the gas in real time. The gas pressurizes the canister, and the pressure of the gas forces the chemical solution out of the bottle, through a chemical supply line, and to a nozzle oriented towards the substrate. The substrate is rotated under the nozzle so that the chemical solution dispensed from the nozzle onto the substrate is dispersed across the substrate. The pressure of the chemical supply solution that flows through the chemical supply line is monitored while the chemical solution is being dispensed from the nozzle, and the pressure of the gas introduced into the canister is controlled on the basis of the monitored pressure of the chemical supply solution. In particular, the rate at which the gas is introduced into the canister is increased when the monitored pressure of the chemical solution is less than the minimum of a predetermined pressure range, and the rate at which the gas is introduced into the canister is decreased when the monitored pressure of the chemical solution is greater than the maximum of the predetermined pressure range.

BRIEF DESCRIPTION OF THE DRAWINGS

The above and other objects, features and advantages of the present invention will become more apparent to those of ordinary skill in the art by referring to the following detailed description of the preferred embodiment(s) thereof made with reference to the attached drawings in which.

DETAILED DESCRIPTION OF THE PREFERRED EMBODIMENTS

The present invention will now be described more fully hereinafter with reference to the accompanying drawings. However, those portions of the present invention which are well-known per se will not be described in detail so as not to obscure the gist of the present invention.

Figure 2:
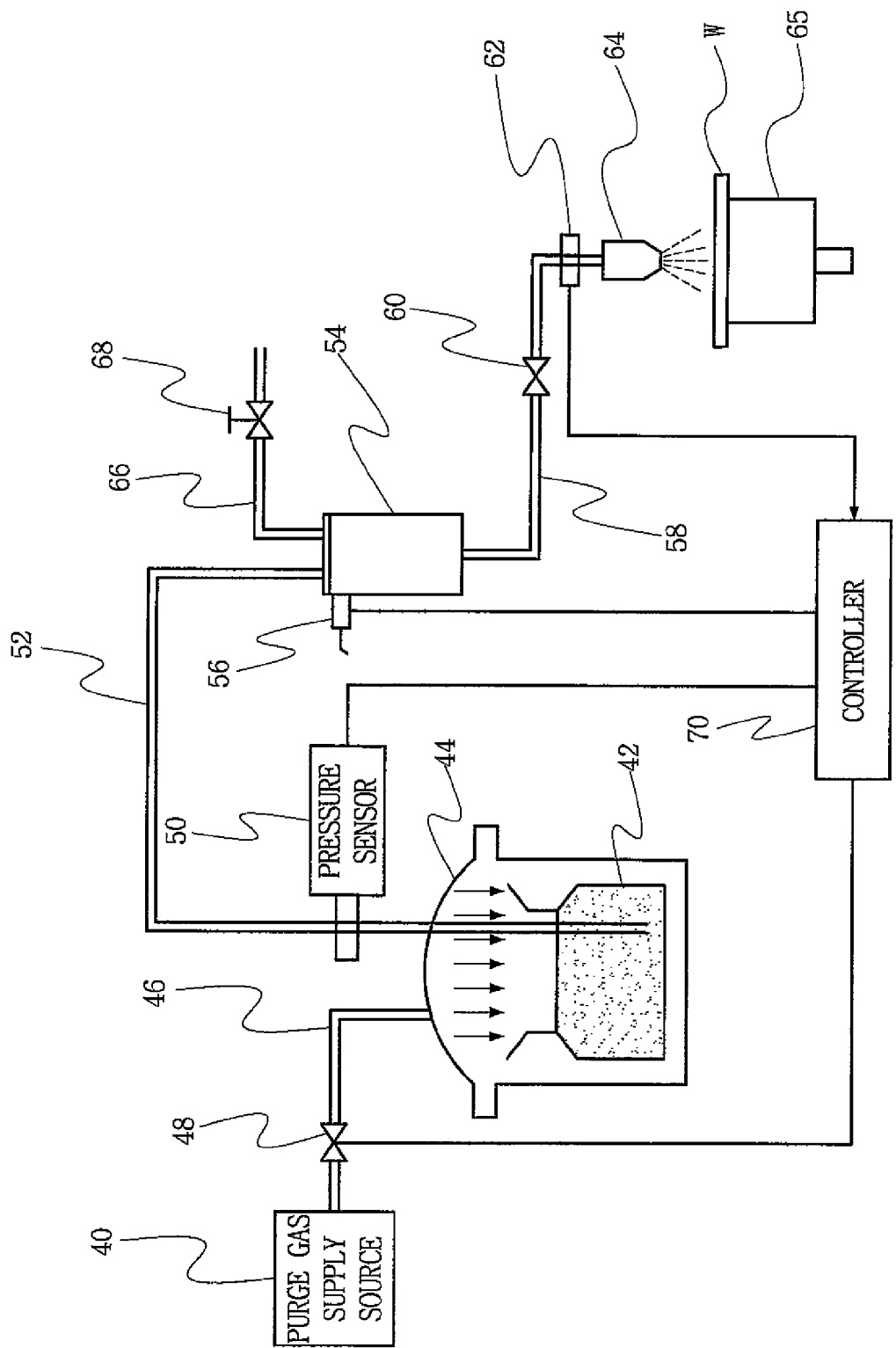
FIG. 2 is a schematic diagram of an embodiment of chemical solution dispensing apparatus according to the present invention.

Referring to FIG. 2, apparatus for dispensing a chemical solution (a fluid) according to the present invention includes an $N_2$ purge gas supply source 40 comprising a source of $N_2$, a canister 44 configured to receive a bottle 42 containing the chemical solution to be dispensed, gas supply piping 46 connecting the gas supply source 40 to the canister 44 so that $N_2$ can be supplied into the canister 44, a pressure control valve 48 disposed in the gas supply piping 46 and controllable to regulate the pressure of the $N_2$ supplied into the canister 44, a first chemical supply line 52 extending from the bottle 42 within the canister 44, and a pressure sensor 50 operatively associated with the first chemical supply line 52 so as to sense the pressure of the chemical solution in the first chemical supply line 52. The pressure control valve 48, as is known in the fluid control art per se, is movable in increments between open and closed positions to control the pressure of the gas flowing through the gas supply line 52.

The dispensing apparatus also has a trap in the form of a tank 54 connected to the bottle 42 by the first chemical supply line 52 so as to receive chemical solution from the bottle 42, a photo sensor 56 including a light emitter and a light receptor for sensing for the presence of chemical solution in the tank 54, a second chemical supply line 58 extending from and connected to the tank 54 and through which chemical solution is fed out of the tank 54, a suck back valve 60 disposed in the second chemical supply line 58 and operable to create suction in the portion of the line 58 downstream thereof, a bubble sensor 62 operatively associated with the portion of the second chemical supply line 58 disposed downstream of the suck back valve 60 for sensing whether bubbles are present in the chemical solution flowing through the second chemical supply line 58 after having passed through the suck back valve 60, and a nozzle 64 connected to the second chemical supply line 58 for dispensing chemical solution supplied through the second chemical supply line 58 towards a spin (rotary) chuck 65 of the spin-coating equipment.

The chuck 65 supports a wafer W which is to be coated by the chemical solution dispensed from nozzle 64. The dispensing apparatus also has an exhaust line 66 connected to an upper end of the tank 54, a drain valve 68 disposed in the exhaust line 66 for allowing bubbles in the chemical solution to be vented, and a controller 70 for controlling the operation of the spin-coating equipment including components of the dispensing apparatus.

More specifically, the controller 70 is operatively connected to the pressure sensor 50 to receive a signal from the pressure sensor 50 representative of the pressure of the chemical solution flowing through the first chemical supply line 52. The controller 70 is also configured to compare a value of the signal with values representative of a predetermined pressure range. The pressure control valve 48 is operatively connected to the controller 70 so as to be controlled by the controller 70 on the basis of the comparison between the value of the signal output by the pressure sensor 50 and values representative of the predetermined pressure range. That is, the pressure control valve 48 is controlled by the feedback from the pressure sensor 50. The controller 70 is also operatively connected to the bubble sensing sensor 62 so as to receive a signal, generated by the bubble sensor, indicative of whether bubbles are present in the chemical solution flowing to the nozzle 64. The controller 70 is also operative to generate an interlock signal which will stop the operation of the dispensing apparatus and hence, will stop the operation of the spin-coating equipment.

The operation of the apparatus for dispensing a chemical solution according to the present invention will now be described in detail.

When chemical solution is to be dispensed onto the wafer W, the controller 70 opens the pressure control valve 48. As a result, $N_2$ flows into the canister 44 from the gas supply source 40 and the chemical solution stored in the bottle 42 is pressurized. Accordingly, the chemical solution is forced through the first chemical supply line 52 and flows into the tank 54. The chemical solution is also forced by this pressure from the tank 54, and through the second chemical supply line 58 and nozzle 64. As a result, the chemical solution is dispensed onto the wafer W mounted to the spin chuck 65.

At this time, the pressure sensor 50 in the first chemical supply line 52 senses the pressure of the chemical solution which is being dispensed by the nozzle 64. Signals indicative of the pressure are issued by the pressure sensor 50 to the controller 70. The controller 70 compares the pressure sensed by the pressure sensor 50 with a predetermined pressure range, e.g., 100±10 kPa. The controller 70 opens the pressure control valve 48 to a greater degree when the pressure sensed by the pressure sensor 50 is less than the minimum of the predetermined pressure range. Thus, the rate at which the gas flows into the canister 44 increases. Similarly, the controller 70 moves the pressure control valve 48 towards its closed position when the pressure sensed by the pressure sensor 50 is more than the maximum of the predetermined pressure range. Thus, the rate at which the gas flows into the canister 44 decreases. The operation is controlled in this way until a fixed quantity of the chemical solution, e.g. 3.5 g±0.2 g, is dispensed from the nozzle 64. Then, the controller 70 suspends the operation of the apparatus.

Also, the photo sensor 56 senses for the presence of the chemical solution in the tank 54. When the bottle 42 is emptied as the chemical solution is dispensed through the nozzle 64, the photo sensor 56 will sense that the tank 54 is no longer filled with the chemical solution. The bottle 42 can then be replaced. Then, chemical solution enters the tank 54 again and the controller 70 keeps the pressure control valve 48 open at least until the pressure sensor 56 senses that the tank 54 is full.

The bubble sensor 62 senses whether bubbles are present in the chemical solution flowing through the second chemical supply line 58 downstream of the tank 54. The controller 70 is operatively connected to the bubble sensor 62 and generates an interlock signal that stops the operation of the spin-coating equipment when bubbles are sensed by the bubble sensor 62. The dispensing apparatus of the present invention as described above is particularly adept at dispensing chemical solutions having relatively high viscosities. Examples of such chemical solutions are provided in Table 1 below:

TABLE 1

| Polymide chemical | Viscosity mPa · s | characteristic |
|---|---|---|
| Polymide: PIX 1400 | 1000 cp | non-photosensitive |
| Polymide: PIX 3400 | 1400 cp | non-photosensitive |
| Pspi: SMAS-5000 | 2000 cp | photosensitive |
| Pspi: TAMS-1100 | 1000 cp | photosensitive |
| Pspi: TAMS-1900 | 1800 cp | photosensitive |

Figure 1:
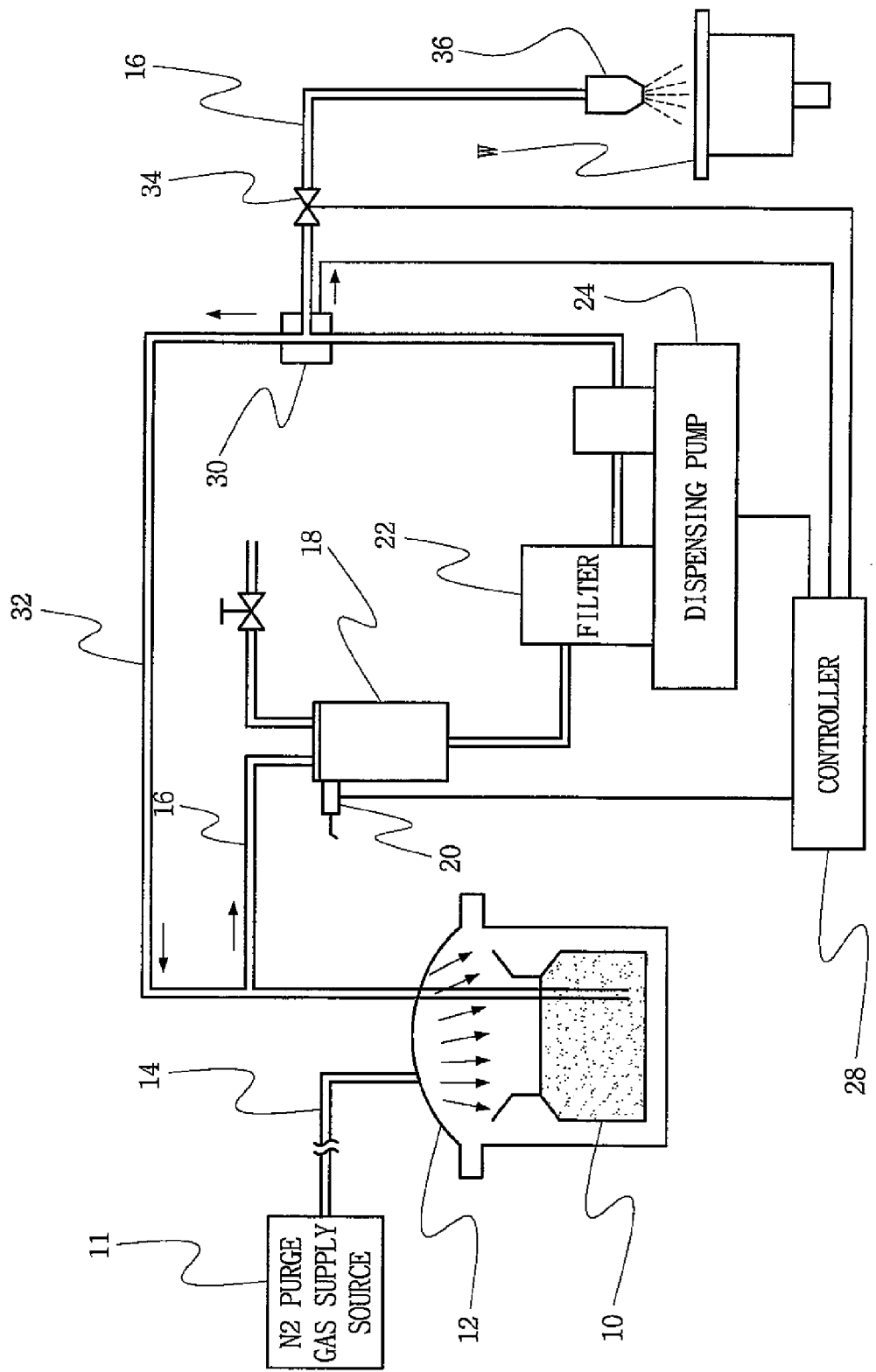
FIG. 1 is a schematic diagram of conventional chemical solution dispensing apparatus.

The conventional dispensing apparatus of FIG. 1, using the dispensing pump 24, takes about five hours to empty a bottle containing 1000 cc of any of the chemical solutions shown in Table 1. However, a dispensing apparatus according to the present invention takes only twenty minutes, using just the $N_2$.

Also, the dispensing apparatus according to the present invention requires much less time than the conventional apparatus to dispense the amount of chemical solution required by the coating recipe, i.e., a fixed amount of the chemical solution dispensed during the coating of one wafer W. For example, the present invention can dispense 3.5 g±0.2 g of the chemical solution in about 30 seconds. However, the conventional dispensing pump 24 requires 60 seconds to dispense 3.5 g±0.2 g of the same chemical solution.

Therefore, the present invention is much more efficient than the conventional dispensing apparatus. Furthermore, the present invention is more reliable, and is significantly less expensive to install and maintain because it obviates the need for a dedicated pump and three-way valve.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. Apparatus for dispensing a chemical solution, comprising:
   a canister configured to receive a bottle containing chemical solution; a source of gas;
   gas supply piping extending between and connecting the canister and the source of gas and through which gas from the source can flow into the canister, whereby the interior of the canister is pressurized by the gas;
   a pressure control valve disposed in the gas supply piping and movable in increments between open and closed positions to control the pressure of the gas flowing through the gas supply piping;
   a trap comprising a tank;
   a first chemical supply line extending from the canister to the tank and through which chemical solution from a bottle received by the canister can flow into the tank;
   a nozzle from which the chemical solution is dispensed by the apparatus;
   a second chemical supply line extending between and connecting the tank and the nozzle and through which chemical solution can flow to the nozzle from the tank;
   a pressure sensor disposed in-line in the apparatus between the canister and the nozzle so as to sense the pressure of the chemical solution that has left the canister, and operative to output a signal representative of the pressure; and
   a controller operatively connected to the pressure sensor to receive the signal from the pressure sensor representative of the pressure of the chemical solution, the controller being configured to compare a value of the signal with values representative of a predetermined pressure range, and the controller being operatively connected to the pressure control valve so as to control the pressure control valve to move toward the open position thereof when the value of the signal output by the pressure sensor is less than a value representative of the minimum of the predetermined pressure range and so as to control the pressure control valve to move toward the closed position thereof when the value of the signal output by the pressure sensor is greater than a value representative of the maximum of the predetermined pressure range, whereby the degree to which the pressure control valve is open is controlled by feedback from the pressure control sensor such that the pressure of the chemical solution remains substantially constant as it is dispensed from the nozzle,
   wherein the pressure sensor is disposed in the first chemical supply line.

2. The apparatus according to claim 1, wherein the source of gas is a source of $N_2$.

3. The apparatus according to claim 1, further comprising an exhaust line connected to an upper end of the tank, and a vent valve disposed in the exhaust line, whereby air in the tank can be vented through the exhaust line and vent valve.

4. The apparatus according to claim 3, further comprising a bubble sensor operatively associated with the second chemical supply line so as to sense whether bubbles are present in chemical solution flowing through the second chemical supply line towards the nozzle, and wherein the controller is operatively connected to the bubble sensor so as to generate an interlock signal that stops the operation of the apparatus when bubbles are sensed by the bubble sensor.

5. The apparatus according to claim 3, further comprising a suck back valve disposed in the second chemical supply line and operable to create suction in the portion of the second chemical supply line downstream thereof to prevent chemical solution adhering to the nozzle from dropping from the nozzle at the end of a dispensing operation.

6. The apparatus according to claim 5, wherein the bubble sensor is operatively associated with the second chemical supply line at a location between the suck back valve and the nozzle.

7. The apparatus according to claim 1, wherein the predetermined pressure range is 100±10 kPa.

* * * * *